United States Patent
Lee

(10) Patent No.: US 10,163,487 B2
(45) Date of Patent: Dec. 25, 2018

(54) SEMICONDUCTOR MEMORY DEVICE

(71) Applicant: SK hynix Inc., Gyeonggi-do (KR)

(72) Inventor: Jong Hoon Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/614,668

(22) Filed: Jun. 6, 2017

(65) Prior Publication Data

US 2018/0082734 A1 Mar. 22, 2018

(30) Foreign Application Priority Data

Sep. 22, 2016 (KR) .......................... 10-2016-0121671

(51) Int. Cl.

| | | |
|---|---|---|
| *G11C 16/26* | (2006.01) | |
| *G11C 11/4094* | (2006.01) | |
| *G11C 11/4063* | (2006.01) | |
| *G11C 11/4074* | (2006.01) | |
| *G11C 11/408* | (2006.01) | |
| *G11C 11/4091* | (2006.01) | |
| *G11C 11/4093* | (2006.01) | |
| *G11C 11/4099* | (2006.01) | |
| *G11C 7/10* | (2006.01) | |
| *G11C 16/10* | (2006.01) | |
| *G11C 16/24* | (2006.01) | |
| *G11C 16/32* | (2006.01) | |
| *G11C 16/34* | (2006.01) | |

(Continued)

(52) U.S. Cl.
CPC .......... *G11C 11/4094* (2013.01); *G11C 7/106* (2013.01); *G11C 11/4063* (2013.01); *G11C 11/4074* (2013.01); *G11C 11/4082* (2013.01); *G11C 11/4091* (2013.01); *G11C 11/4093* (2013.01); *G11C 11/4099* (2013.01); *G11C 16/10* (2013.01); *G11C 16/24* (2013.01); *G11C 16/26* (2013.01); *G11C 16/32* (2013.01); *G11C 16/3459* (2013.01); *G11C 7/12* (2013.01); *G11C 16/0483* (2013.01)

(58) Field of Classification Search
CPC ............................... G11C 16/26; G11C 16/28
USPC ........................................ 365/185.21, 189.05
See application file for complete search history.

(56) References Cited

U.S. PATENT DOCUMENTS

| | | | | |
|---|---|---|---|---|
| 7,447,079 B2 * | 11/2008 | Nguyen | ............... | G11C 11/5628 |
| | | | | 365/185.17 |
| 7,764,547 B2 * | 7/2010 | Lee | ......................... | G11C 16/30 |
| | | | | 365/185.11 |

(Continued)

FOREIGN PATENT DOCUMENTS

| | | |
|---|---|---|
| KR | 1020140028571 | 3/2014 |
| KR | 1020150028785 | 3/2015 |

*Primary Examiner* — Son Mai

(74) *Attorney, Agent, or Firm* — IP & T Group LLP

(57) ABSTRACT

Provided herein is a semiconductor memory device. The semiconductor memory device may include a memory cell array including a plurality of memory cells coupled to a plurality of bit lines and a page buffer circuit coupled to the plurality of bit lines and including a plurality of page buffers, wherein the plurality of page buffers sense program states of the plurality of memory cells through the plurality of bit lines during a verify operation or a read operation of a program operation, and wherein the plurality of page buffers perform in an alternate way a latch operation for latching sensing data in accordance with current amounts of the plurality of bit lines.

17 Claims, 7 Drawing Sheets

(51) Int. Cl.
*G11C 7/12* (2006.01)
*G11C 16/04* (2006.01)

(56) References Cited

U.S. PATENT DOCUMENTS

| | | | | |
|---|---|---|---|---|
| 8,300,473 | B2* | 10/2012 | Cernea | G11C 7/062 |
| | | | | 365/185.21 |
| 9,633,741 | B1* | 4/2017 | Matsuo | G11C 16/26 |
| 2014/0369133 | A1* | 12/2014 | Lee | G11C 16/26 |
| | | | | 365/185.21 |
| 2015/0049553 | A1* | 2/2015 | Maejima | G11C 16/26 |
| | | | | 365/185.18 |
| 2017/0076790 | A1* | 3/2017 | Sasaki | G11C 11/5642 |

* cited by examiner

SEMICONDUCTOR MEMORY DEVICE

CROSS-REFERENCE TO RELATED APPLICATION

The present application claims priority under 35 U.S.C. § 119(a) to Korean patent application number 10-2016-0121671 filed on Sep. 22, 2016, which is herein incorporated by reference n its entirety.

BACKGROUND

Field of Disclosure

Various embodiments of present disclosure relate to a semiconductor memory device.

Description of Related Art

Semiconductor memory devices are generally categorized into volatile memory devices and nonvolatile memory devices.

In a non-volatile memory device, write and read operations are performed in a comparatively slow speed, but stored data is maintained even when a power supply is discontinued. Therefore a non-volatile memory device is used to store data that need to be maintained even when the power supply to the device is turned off. Examples of a non-volatile memory device include a read only memory (ROM), a mask ROM (MROM), a programmable ROM (PROM), an erasable programmable ROM (EPROM) an electrically erasable programmable ROM (EEPROM) a flash memory, a phase change random access memory (PRAM), a magnetic RAM (MRAM), a resistive RAM (RRAM), and a ferroelectric RAM (FRAM). A flash memory may be a NOR type or a NAND type.

A flash memory combines advantages of a RAM in that it is freely data programmed and erased, and advantages of a ROM in that it is capable of retaining stored data even when a power supply is interrupted. Flash memories have been widely used as storage media for portable electronic devices such as a digital camera, a personal digital assistant (PDA), and an MP3 player.

SUMMARY

One aspect of the present disclosure is directed to a semiconductor memory device capable of reducing a power supply voltage drop by a page buffer during a verify operation or a read operation of the semiconductor memory device. Another aspect of the present disclosure is directed to a method of operating the semiconductor memory device.

One embodiment of the present disclosure provides a semiconductor memory device including a memory cell array including a plurality of memory cells coupled to a plurality of bit lines and a page buffer circuit coupled to the plurality of bit lines and including a plurality of page buffers, wherein the plurality of page buffers sense program states of the plurality of memory cells through the plurality of bit lines during a verify operation or a read operation of a program operation, and wherein the plurality of page buffers perform in an alternate way a latch operation for latching sensing data in accordance with current amounts of the plurality of bit lines.

Another embodiment of the present disclosure provides a semiconductor memory device including a memory cell array including a plurality of memory cells coupled to a plurality of bit lines, a strobe signal generation circuit, alternately generating a plurality of strobe signals having different activation periods and a page buffer circuit coupled to the plurality of bit lines and including a plurality of page buffers, wherein the plurality of page buffers sense program states of the plurality of memory cells through the plurality of bit lines during a verify operation or a read operation of a program operation, and wherein the plurality of page buffers perform a latch operation for latching sensing data in response to the plurality of strobe signals.

BRIEF DESCRIPTION OF THE DRAWINGS

The above and other features and advantages of the present invention will become more apparent to those skilled in the art to which the present invention pertains by the following detailed description with reference to the attached drawings in which.

DETAILED DESCRIPTION

Figure 1:
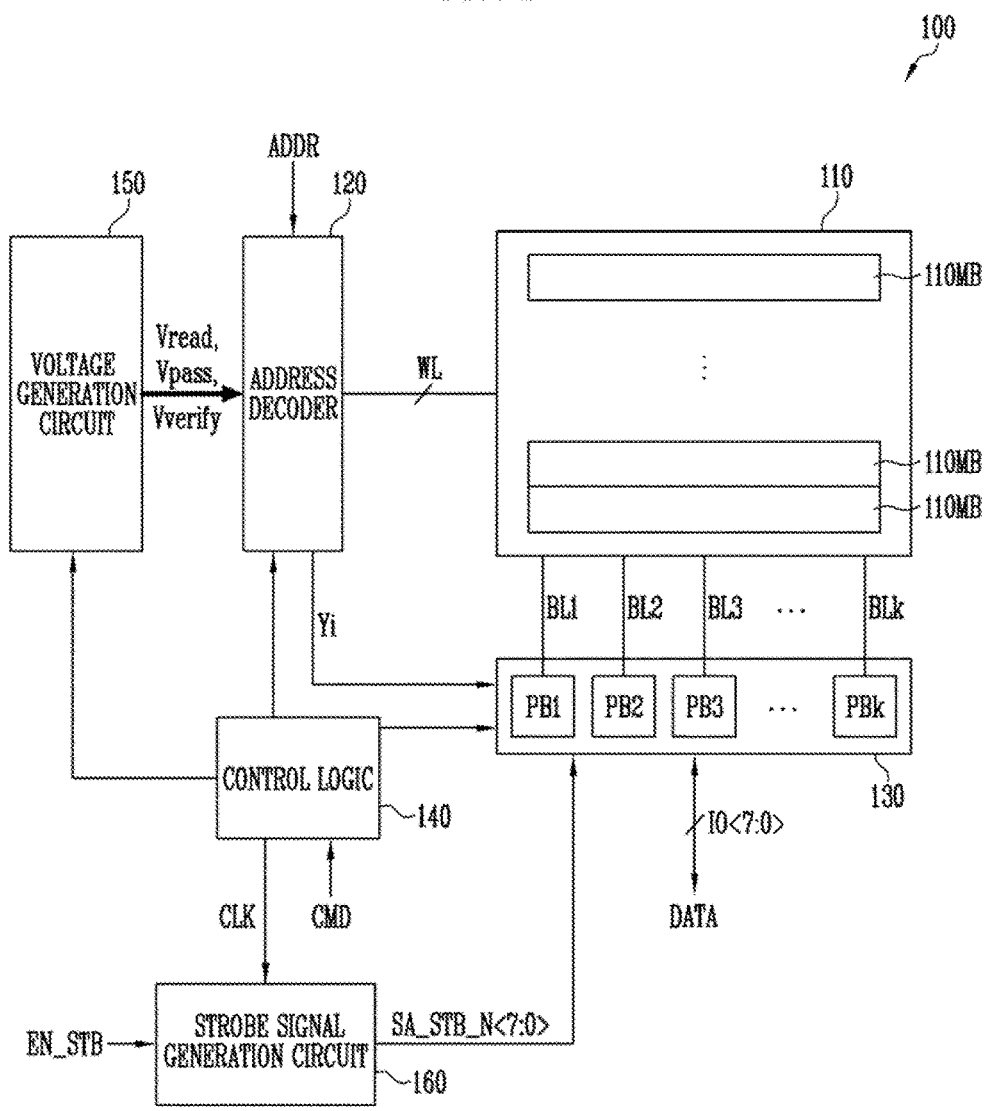
FIG. 1 is a block diagram showing a semiconductor memory device according to an embodiment of the present disclosure.

Hereinafter, embodiments of the present disclosure will be described in greater detail with reference to the accompanying drawings. However, we note that the present disclosure may be embodied in different other forms and should not be construed as being limited only to the embodiments set forth herein. Rather, these embodiments are provided so that this disclosure will be thorough and complete, and will fully convey the scope of the example embodiments to those skilled in the art.

Furthermore, a singular form may include a plural from as long as it is not specifically mentioned in a sentence. It is also noted that in this specification, "coupled/coupled" refers to one component not only directly coupling another component but also indirectly coupling another component through an intermediate component. Furthermore, "directly coupled/directly coupled" refers to one component directly coupling another component without an intermediate component.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

The phrase "at least one of . . . and . . . ," when used herein with a list of items, means a single item from the list or any combination of items in the list. For example, "at least one of A, B, and C" means, only A, or only B, or only C, or any Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

FIG. 1 is a block diagram showing a semiconductor memory device 100 according to an embodiment of the present disclosure.

Referring to FIG. 1, the semiconductor memory device 100 may include a memory cell array 110, an address decoder 120, a page buffer circuit 130, a control logic 140, a voltage generation circuit 150, and a strobe signal generation circuit 160. The strobe signal generation circuit 160 may be designed as a constituent element included in the control logic 140.

The memory cell array 110 may include a plurality of memory blocks 110MB. The plurality of memory blocks 110MB may be coupled to the address decoder 120 through a plurality of word lines WL. The plurality of memory blocks 110MB may be coupled to the page buffer circuit 130 through a plurality of bit lines BL1 to BLk. Each of the plurality of memory blocks 110MB may include a plurality of memory cells. According to an embodiment, the plurality of memory cells may be non-volatile. The plurality of memory cells may define a plurality of memory cells coupled to the same word line as a single page. The memory cell array 110 may consist of a plurality of pages.

In addition, each of the plurality of memory blocks 110MB of the memory cell array 110 may include a plurality of cell strings. Each of the plurality of cell strings may include a drain select transistor, a plurality of memory cells, and a source select transistor coupled in series between a bit line and a source line (see FIG. 2).

The address decoder 120 may be coupled to the memory cell array 110 through the plurality of word lines WL. The address decoder 120 may be configured to operate in response to control of the control logic 140. The address decoder 120 may receive an address ADDR through an input/output buffer (not shown) in the semiconductor memory device 100.

The address decoder 120 may apply a plurality of operation voltages including a read voltage Vread and a pass voltage Vpass generated during an read operation in the voltage generation circuit 150 and a verify voltage Vverify and the pass voltage Vpass generated during a verify operation to the plurality of memory cells, the drain select transistor and the source select transistor included in the memory cell array 110 in accordance with the address ADDR.

The address ADDR received during all operations may include a block address, a row address, and the column address Yi. The address decoder 120 may select at least one of the plurality of word lines WL after selecting at least one of the plurality of memory blocks 110MB according to the block address and the row address.

The address decoder 120 may also be configured to decode a column address Yi of the received address ADDR during all operations including a program operation or the read operations. The address decoder 120 may transmit the decoded column address Yi to the page buffer circuit 130. The page buffer circuit 130 may include a plurality of page buffers PB1 to PBk. The plurality of page buffers PB1 to PBk may be coupled to the memory cell array 110 through the plurality of bit lines BL1 to BLk. Each of the plurality of page buffers PB1 to PBk may perform a sensing operation for sensing data stored in the memory cells during the verify operation or the read operation of the program operation. Each of the plurality of page buffers PB1 to PBk may perform a sensing data latch operation in response to a plurality of strobe signals SA_STB_N<7:0> sequentially activated.

The page buffer circuit 130 may operate under the control of the control logic 140 and the plurality of page buffers PB1 to PBk may sense the current amounts of the plurality of bit lines BL1 to BLk corresponding thereto during a program verify operation to perform the program verify operation of the memory cells. In addition, the plurality of page buffers PB1 to PBk may sense the current amounts of the plurality of bit lines BL1 to BLk corresponding thereto during the read operation to read the data stored in the memory cells.

The plurality of page buffers PB1 to PBk may perform the sensing data latch operation in response to the plurality of strobe signals SA_STB_N<7:0>. Data sensed by the page buffer circuit 130 during the read operation may be output to an outside device via input/output data lines IO<7:0>.

The plurality of page buffers PB1 to PBk according to the embodiment of the present disclosure may be divided into a plurality of groups according to the corresponding input/output data lines IO<7:0>, and a single page buffer group corresponding to a single input/output data line may simultaneously perform the sensing data latch operation in response to a single strobe signal. That is, the plurality of page buffers PB1 to PBk may be divided into a plurality of page buffer groups according to the corresponding input/output data lines, and the plurality of page buffer groups may perform the sensing data latch operation in response to the strobe signals SASTB_N<7:0>, respectively.

The control logic 140 may be coupled to the address decoder 120, the page buffer circuit 130, the voltage generation circuit 150 and the strobe signal generation circuit 150. The control logic 140 may receive a command CMD through an input/output buffer (not shown) of the semiconductor memory device 100. The control logic 140 may be configured to control all operations of the semiconductor memory device 100 in response to the command CMD.

The control logic 140 may control the plurality of page buffers PB1 to PBk during the verify operation and the read operation of the program operation to perform the sensing operation. In addition, the control logic 140 may control the voltage generation circuit 150 to generate the verify voltage verify and the pass voltage Vpass during the verify operation of a program operation or the read voltage Vread and the pass voltage Vpass during a read operation. The control logic 140 may control the address decoder 120 to apply the generated operation voltages to one or more selected word lines of the selected memory block.

In addition, the control logic 140 may generate a clock signal CLK that toggles at a predetermined interval to output the clock signal CLK to the strobe signal generation circuit 160 during the verify operation and the read operation.

The voltage generation circuit 150 may generate and output the verify voltage Verify and the pass voltage Vpass or the read voltage Vread and the pass voltage Vpass during the verify operation and the read operation in accordance with the control of the control logic 140.

The strobe signal generation circuit 160 may generate and output the plurality of strobe signals SA_STB_N<7:0> for controlling the page buffer circuit 130 to perform the sensing data latch operation for latching the sensing data during the verify operation or the read operation. The strobe signal generation circuit 160 may generate and output the plurality of strobe signals SA_STB_N<7:0> sequentially activated in response to an enable signal EN_STB and the clock signal CLK during the sensing data latch operation.

Although shown as being disposed outside the control logic 140 in an embodiment of the present disclosure, the strobe signal generation circuit 160 may be designed to be included in the control logic 140.

Figure 2:
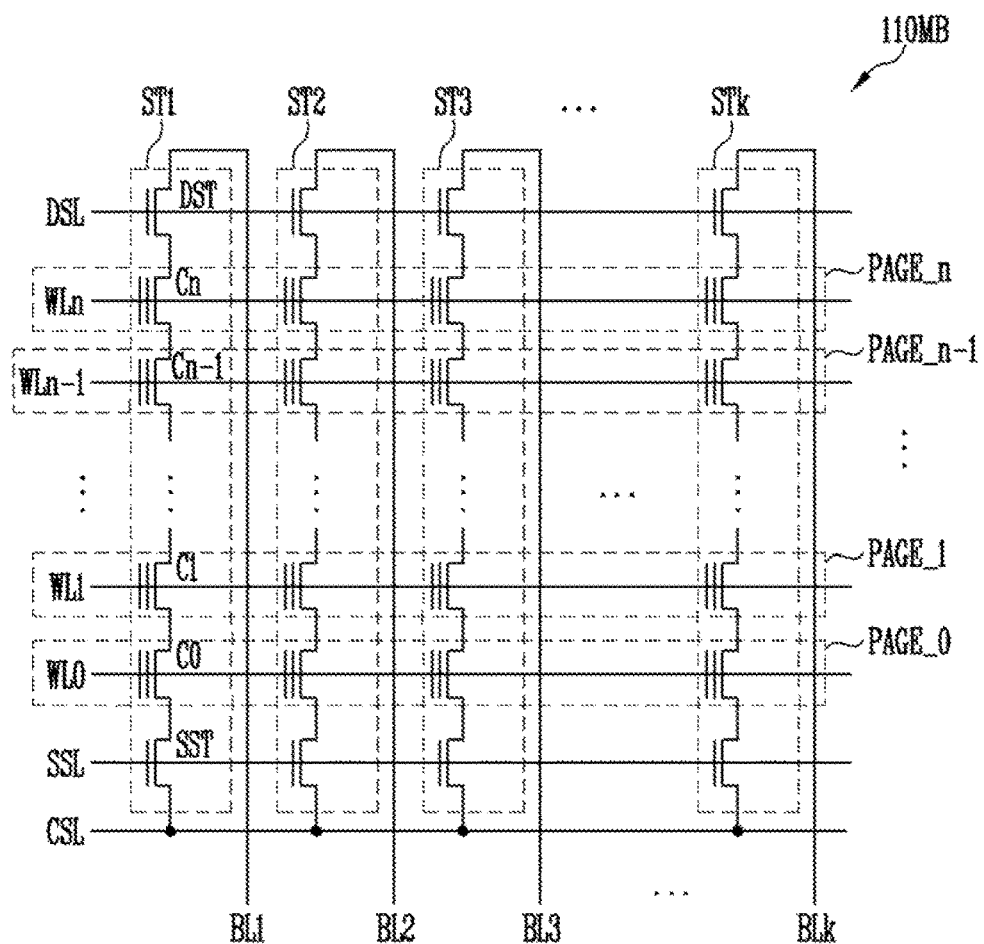
FIG. 2 is a circuit diagram illustrating one of the memory blocks of FIG. 1.

FIG. 2 is a circuit diagram illustrating one of memory blocks of FIG. 1.

Since the memory blocks of FIG. 1 may be similar with one another, only one of the memory blocks will be exemplarily described.

Referring to FIG. 2, the memory block 110MB may include a plurality of cell strings ST1 to STk coupled between the bit lines BL1 to BLk and a common source line CSL. For example, the bit lines BL1 to BLk may be coupled to the cell strings ST1 to STk, respectively, and the common source line CSL may be commonly coupled to the cell strings ST1 to STk.

Since the plurality of cell strings ST1 to STk may be similar with one another, a first cell string ST1 will be exemplarily described.

The first cell string ST1 may include a source select transistor SST, a plurality of memory cells C0 to Cn, and a drain select transistor DST coupled in series between the common source line CSL and the first bit line BL1. Gates of the source select transistors SST coupled to different cell strings ST1 to STk may be coupled to a source select line SSL and gates of the plurality of memory cells C0 to Cn may be coupled to a plurality of word lines WL0 to WLn, respectively, and gates of the drain select transistors DST coupled to different cell strings ST1 to STk may be coupled to a drain select line DSL.

For example, the memory block 110MB may include a plurality of pages PAGE_0 to PAGE_n. Each of the pages may serve as a basic unit during the program operation and the read operation.

Figure 3:
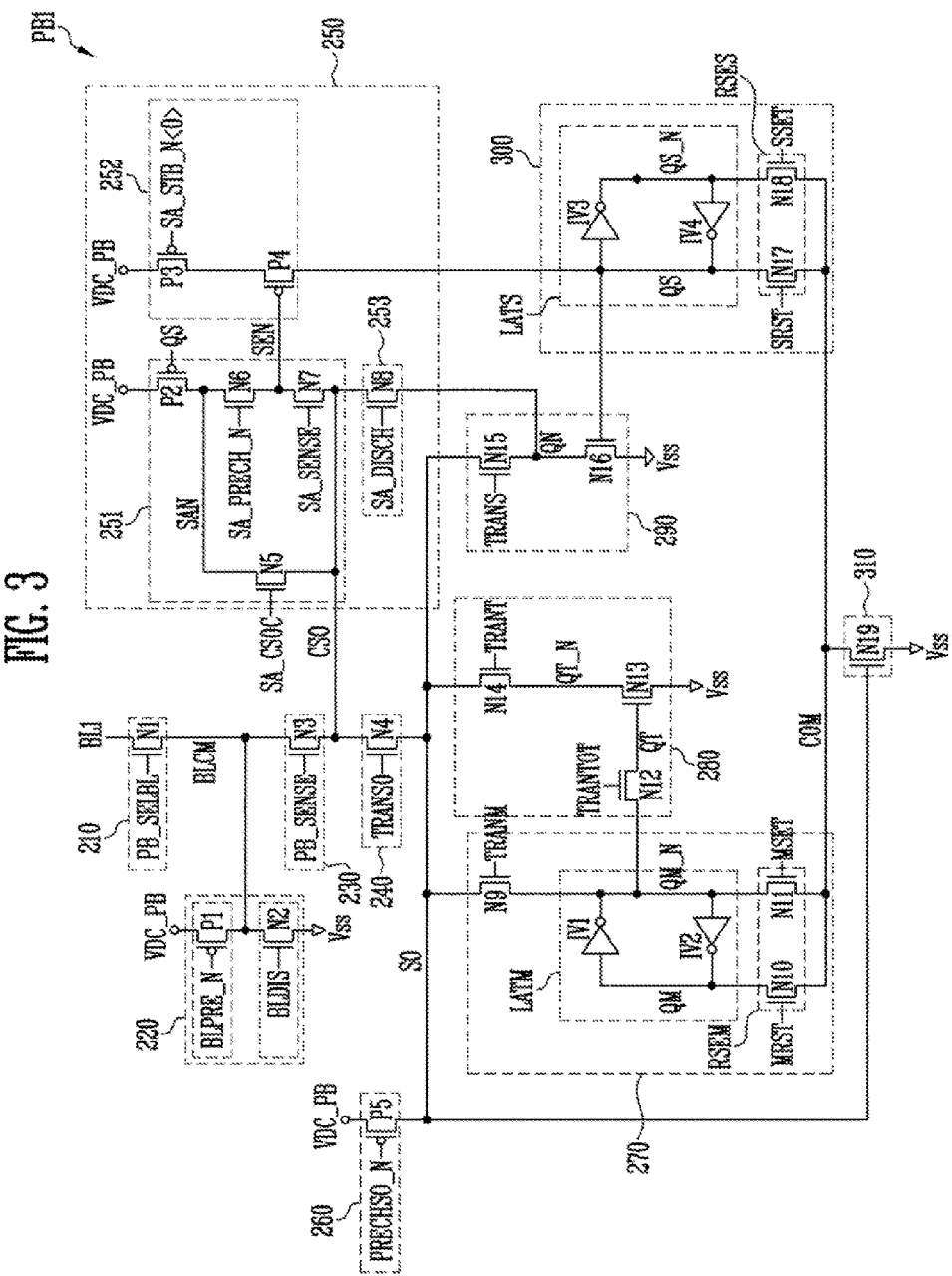
FIG. 3 is a circuit diagram illustrating a page buffer employed in the semiconductor memory device of FIG. 1.

FIG. 3 is a circuit diagram illustrating a page buffer of FIG. 1.

Since the plurality of page buffers PB1 to PBk may be similar with one another, only the page buffer PB1 will be exemplarily described.

Referring to FIG. 3, the page buffer PB1 may include a bit line connection circuit 210, a bit line setup circuit 220, a page buffer sensing circuit 230, a sensing node connection circuit 240, a current control circuit 250, a sensing node precharge circuit 260, a main latch 270, a dynamic latch 280, a first discharge circuit 290, a latch circuit 300, and a second discharge circuit 310.

The bit line connection circuit 210 may be coupled between the bit line BL1 and a bit line connection node BLCM. The bit line connection circuit 210 may include an NMOS transistor N1 operating in response to a bit line selection signal PB_SELBL. The NMOS transistor N1 may be turned on or turned off in response to the bit line select signal PB_SELBL.

The bit line setup circuit 220 may be coupled between an internal power supply VDC_PB, a ground power supply Vss, and the bit line connection node BLCM and include an NMOS transistor N2 operating in response to a bit line discharge signal BLDIS and a PMOS transistor P1 operating in response to a bit line precharge signal BLPRE_N. The NMOS transistor N2 may be turned on or off in response to a bit line discharge signal BL_DIS to apply the ground power supply Vss to the bit line connection node BLCM. The PMOS transistor P1 may apply the internal power supply VDC_PB to the bit line connection node BLCM to precharge the bit line connection node BLCM in response to the bit line precharge signal BLPRE_N.

The page buffer sensing circuit 230 may be coupled between the bit line connection node BLCM and a current sensing node CSO. The page buffer sensing circuit 230 may include an NMOS transistor N3 operating in response to a page buffer sensing signal PB_SENSE. The NMOS transistor N3 may be turned on or off in response to the page buffer sensing signal PB_SENSE.

The sensing node connection circuit 240 may be coupled between the current sensing node CSO and a sensing node SO and include an NMOS transistor N4 operating in response to a node connection signal TRANSO. The NMOS transistor N4 may be turned on or off in response to the node connection signal TRANSO.

The current control circuit 250 may include a clamp circuit 251, a current determination circuit 252, and a sensing discharge circuit 253.

The clamp circuit 251 may include NMOS transistors N5 to N7 and a PMOS transistor P2. The PMOS transistor P2 may be coupled between an internal power supply VDC_PB terminal and a sense amplifier node SAN and turned on or off in response to a potential of a first node QS of the latch circuit 300. The NMOS transistor N5 may be coupled between the PMOS transistor P2 and the current sensing node CSO and apply a sensing current for sensing the bit line BL1 to the current sensing node CSO in response to a current sensing signal SA_CSOC. An NMOS transistor N6 may be coupled between the sense amplifier node SAN and an internal sensing node SEN and apply the internal power supply VDC_PB to the internal sensing node SEN in response to an internal sensing node precharge signal SA_PRECH_N. An NMOS transistor N7 may be coupled between the internal sensing node SEN and the current sensing node CSO and electrically connect the internal sensing node SEN and the current sensing node CSO in response to an internal sensing node sensing signal SA_SENSE.

The current determination circuit 252 may include PMOS transistors P3 and P4. The PMOS transistor P3 may be coupled between the internal power supply VDC_PB terminal and the PMOS transistor P4 and turned on or off in response to a strobe signal SA_STB_N<0>. The PMOS transistor P4 may be coupled between the PMOS transistor P3 and the first node QS of the latch circuit 300 and turned on or off in response to a potential level of the internal sensing node SEN. The current determination circuit 252 may apply or block the internal power supply VDC_PB to or from the latch circuit 300 according to the potential level of the internal sensing node SEN during the time when the strobe signal SA_STB_N<0> is activated during the sensing data latch operation thereby controlling the sensing data latch operation of the page buffer PB1.

The sensing discharge circuit 253 may be coupled between the current sensing node CSO and a QN node of the first discharge circuit 290 and turn on in response to an internal sensing node discharge signal SA_DISCH.

The sensing node precharge circuit 260 may be coupled between the internal power supply VDC_PB terminal and the sensing node SO and include a PMOS transistor P5 operating in response to a precharge signal PRECHSO_N. The PMOS transistor P5 may supply the internal power supply VDC_PB to the sensing node SO in response to the precharge signal PRECHSO_N.

The main latch 270 may include an NMOS transistor N9, a latch LATM, and a main latch reset/setup circuit RSEM. The main latch 270 may receive and temporarily store program data.

The NMOS transistor N9 may electrically connect the sensing node SO with a first main node QM_N of the latch LATM in response to a main data transmission signal TRANM.

The latch LATM may include inverters IV1 and IV2. The inverters IV1 and IV2 may be coupled in parallel to each other between first and second main nodes QM_N and QM of the latch LATM. An input terminal of the inverter IV1 may be coupled to the second main node QM, and an output terminal thereof may be coupled to the first main node QM_N. An input terminal of the inverter IV2 may be coupled to the first main node QM_N and an output terminal thereof may be coupled to the second main node QM.

The main latch reset/setup circuit RSEM may be coupled to the first and second main nodes QM_N and QM of the latch LATM and may reset or set up the latch LATM. For example, the main latch reset/setup circuit RSEM may include NMOS transistors N10 and N11. The NMOS transistor N10 may electrically connect the second main node QM with a common node COM of the latch LATM in response to a main reset signal MRST. The NMOS transistor N11 may electrically connect the first main node QM_N with the common node COM of the latch LATM in response to a main set-up signal MSET. The main latch reset/setup circuit RSEM may initialize the latch LATM so that the second main node QM may be at a low level and the first main node QM_N may be at a high level by electrically connecting the common node COM coupled to a ground power supply with the second main node QM in response to the main reset signal MRST during an initializing operation of the latch LATM and maintain or invert logic levels of the second main node QM and the first main node QM_N in response to the main set-up signal MSET whose logic level is determined according to a program data value during a program data input operation.

The dynamic latch 280 may include NMOS transistors N12, N13, and N14. The dynamic latch 280 may store program operation information. For example, the dynamic latch unit 280 may store program operation information of one of a multilevel cell (MLC), a triple level cell (TLC) and a quad level cell (QLC).

The NMOS transistor N12 may electrically connect the first main node QM_N with a dynamic node QT in response to a dynamic data transmission signal TRANTOT. The NMOS transistor N13 may be coupled between an NMOS transistor N14 and a ground terminal Vss and turned on or off in response to a potential of the dynamic node QT. The NMOS transistor N14 may be coupled between the sensing node SO and the NMOS transistor N13 and turned on or off in response to the dynamic data transmission signal TRANT.

The first discharge circuit 290 may include NMOS transistors N15 and N16 coupled in series between the sensing node SO and a ground terminal Vss. The NMOS transistor N15 may be turned on or off in response to a transfer signal TRANS and the NMOS transistor N16 may be turned on or off in response to a potential of the first node QS of the latch circuit 300.

The latch circuit 300 may include a sensing latch LATS and a sensing latch reset/setup unit RSES. The sensing latch LATS may include inverters IV3 and IV4. The inverters IV3 and IV4 may be coupled in parallel to each other between the first and second sensing nodes QS and QS_N of the sensing latch LATS. For example, an input terminal of the inverter IV3 may be coupled to the first sensing node QS, and an output terminal thereof may be coupled to the second sensing node QS_N. An input terminal of the inverter IV4 may be coupled to the second sensing node QS_N and an output terminal thereof may be coupled to the first sensing node QS.

The sensing latch reset/setup unit RSES may be coupled to the first and second sensing nodes QS and QS_N of the sensing latch LATS and reset or set up the sensing latch LATS. For example, the sensing latch reset/setup unit RSES may include NMOS transistors N17 and N18. The NMOS transistor N17 may electrically connect the first sensing node QS with the common node COM of the sensing latch LATS in response to a sensing reset signal SRST. The NMOS transistor N18 may electrically connect the second sensing node QS_N with the common node COM of the sensing latch LATS in response to a sensing setup signal SSET. The common node COM may be coupled to the ground Vss during a reset operation and a setup operation of the sensing latch LATS.

A current may be supplied to or blocked from the latch circuit 300 through the internal power supply VDC_PB via the current determination circuit 252 during the program verify operation or the read operation, and the sending data may be latched according to the supply of current.

The second discharge circuit 310 may be coupled between the common node COM and the ground Vss and include an NMOS transistor N19 turned on or off according to a potential of the sensing node SO.

Each of the plurality of page buffers PB1 to PBk included in the page buffer circuit 130 described with reference to FIG. 1 may have a structure similar with that of the page buffer PB1 described above, and strobe signals applied to the current determination circuit 252 may be activated in different periods. For example, the plurality of page buffers PB1 to PBk may be defined as the plurality of page buffer groups according to the corresponding input/output lines, and the plurality of page buffer groups may perform the sensing data latch operation in response to the strobe signals SA_XTB_N<7:0> having different activating periods, respectively.

Figure 4:
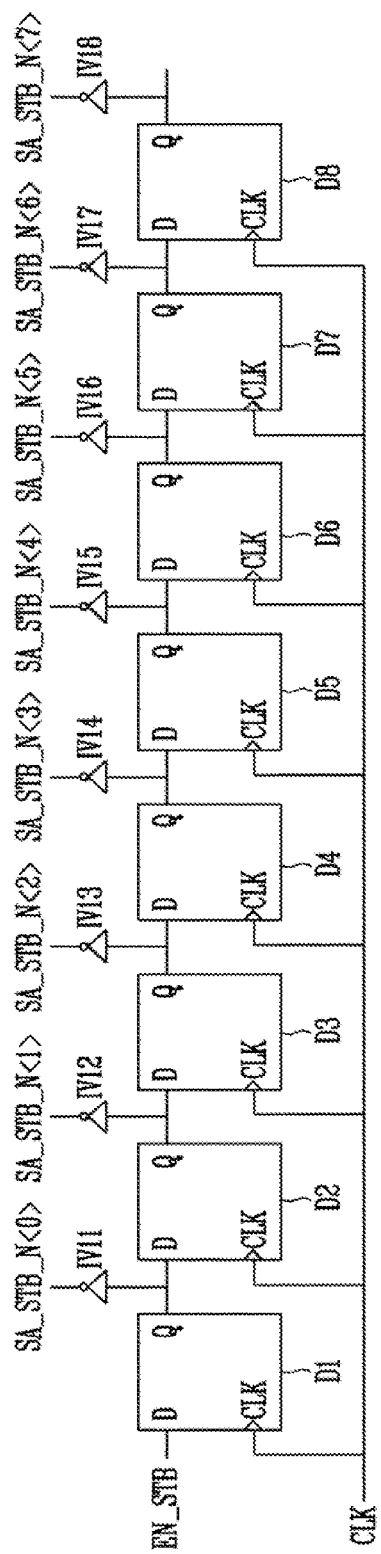
FIG. 4 is a circuit diagram illustrating a strobe signal generation circuit employed in the semiconductor memory device of FIG.

FIG. 4 is a circuit diagram illustrating an exemplary configuration of the strobe signal generation circuit 160 of FIG. 1.

Referring to FIG. 4, the strobe signal generation circuit 160 may include a plurality of delay signal generators D1 to D8 and inverters IV11 to IV18.

The delay signal generator D1 may generate an output signal through a node Q in in response to the enable signal EN_STB and the clock signal CLK. The inverter IV11 may invert the output signal of the delay signal generator D1 to output the strobe signal SA_STB_N<0>.

The delay signal generator D2 may generate an output signal through the Q node in response to the output signal of the delay signal generator D1 and the dock signal CLK. The inverter IV12 may invert the output signal of the delay signal generator D2 to output a strobe signal SA_STB_N<1>.

The delay signal generator D3 may generate an output signal through the Q node in response to the output signal of the delay signal generator D2 and the clock signal CLK. The inverter IV13 may invert the output signal of the delay signal generator D3 to output a strobe signal SA_STB_N<2>.

The delay signal generator D4 may generate an output signal through the Q node in response to the output signal of the delay signal generator D3 and the clock signal CLK. The inverter IV14 may invert the output signal of the delay signal generator D4 to output a strobe signal SA_STB_N<3>.

The delay signal generator D5 may generate an output signal through the Q node in response to the output signal of the delay signal generator D4 and the clock signal CLK. The inverter IV15 may invert the output signal of the delay signal generator D5 to output a strobe signal SA_STB_N<4>.

The delay signal generator D6 may generate an output signal through the Q node in response to the output signal of the delay signal generator D5 and the clock signal CLK. The inverter IV16 may invert the output signal of the delay signal generator D6 to output a strobe signal SA_STB_N<5>.

The delay signal generator D7 may generate an output signal through the Q node in response to the output signal of the delay signal generator D6 and the clock signal CLK. The inverter IV17 may invert the output signal of the delay signal generator D7 to output a strobe signal SA_STB_N<6>.

The delay signal generator D8 may generate an output signal through the Q node in response to the output signal of the delay signal generator D7 and the clock signal CLK. The inverter IV18 may invert the output signal of the delay signal generator D8 to output a strobe signal SA_STB_N<7>.

The plurality of delay signal generators D1 to D8 may include DQ flip flop units.

Figure 5:
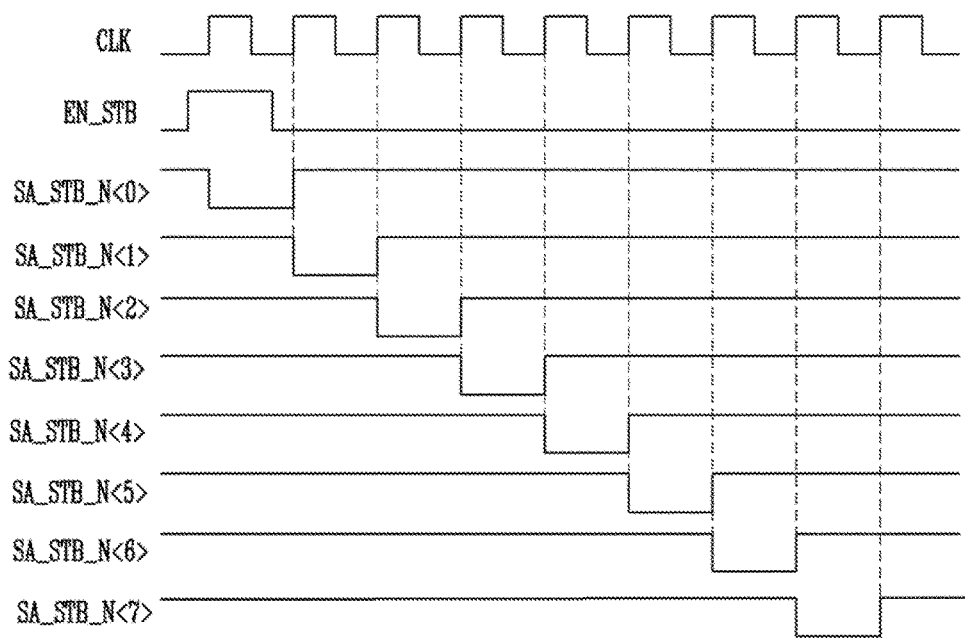
FIG. 5 is a waveform diagram illustrating signals for describing an operation of a semiconductor memory device according to an embodiment of the present disclosure.

FIG. 5 is a waveform diagram illustrating an operation of a semiconductor memory device according to an embodiment of the present disclosure.

An operation of the semiconductor memory device according to the embodiment of the present disclosure will be described with reference to FIGS. 1 to 5.

In the embodiment of the present disclosure, a read operation will be exemplarily described.

During a read operation, the control logic 140 may control the address decoder 120, the page buffer circuit 130, the voltage generation circuit 150, and the strobe signal generation circuit 160 in response to a received command CMD for the read operation.

The voltage generation circuit 150 may generate the read voltage Vread and the pass voltage Vpass to be applied to the word lines WL of the selected memory block 110MB. The address decoder 120 may apply the read voltage Vread to the selected one of the word lines WL of the selected memory block 110 MB and apply the pass voltage Vpass to the remaining unselected word lines of the selected memory block 110 MB.

Subsequently each of the plurality of page buffers PB1 to PBk included in the page buffer circuit 130 may supply the internal power supply VDC_PB to the bit lines BL1 to BLk corresponding thereto to precharge the bit lines BL1 to BLk and sense the current amount of a sense node according to a potential level of the bit line that is varied depending on a program state of a memory cell coupled to the selected word line to sense the data stored in the selected memory cell.

The read operation above will be described in more detail exemplifying a read operation of a memory cell C1 coupled to the bit line BL1.

The bit line connection circuit 210 may electrically connect the bit line BL1 with the bit line connection node BLCM in response to the bit line selection signal PB_SELBL.

The bit line setup circuit 220 may apply the internal power supply VDC_PB to the bit line BL1 to precharge the bit line BL1 in response to the bit line precharge signal BLPRE_N.

The read voltage Vread may be applied to a selected word line WL1 coupled to the selected memory cell C1 and the pass voltage Vpass may be applied to the remaining unselected word lines. Therefore, the remaining memory cells, except for the selected memory cell C1, may be turned on by the pass voltage Vpass. When a threshold voltage of the memory cell C1 is higher than the read voltage Vread, the memory cell C1 may be turned on. When the threshold voltage of the memory cell C1 is lower than the read voltage Vread, the memory cell C1 may be turned off. The drain select transistor DST and the source select transistor SST may be turned on by an operation voltage applied to the drain select line DSL and an operation voltage applied to the source select line SSL. Accordingly, a current path coupled from the bit line BL1 to the common source line CSL may be formed or cut off depending on a program state of the selected memory cell C1.

Therefore, the bit line BL1 precharged to an internal power supply VDC_PB level may maintain the precharge level or be discharged to a ground voltage level.

The clamp circuit 251 of the current control circuit 250 may apply the internal power supply voltage VDC_PB to the internal sensing node SEN to precharge in response to the internal sensing node precharge signal SA_PRECH_N. Thereafter, the clamp circuit 251 may apply the sensing current for sensing the bit line BL1 to the sensing node CSO in response to a potential of the first node QS initialized to a low level of the latch circuit 300 and the current sensing signal SA_CSOC.

In response to the page buffer sensing signal PB_SENSE, the page buffer sensing circuit 230 may electrically connect or block the bit line BL1 to or from the current sensing node CSO in accordance with a potential level difference between a potential level of the bit line BL1 and a potential level of the current sensing node CSO. For example, when the potential level of the bit line BL1 is discharged to a low level according to the program state of the memory cell, the bit line BL1 and the current sensing node CSO may be electrically coupled to each other, so that a sensing current applied to the current sensing node CSL may flow through the bit line BL1. On the contrary, when the potential level of the bit line BL1 maintains the precharge level according to the program state of the memory cell, the bit line BL1 and the current sensing node CSO may be electrically blocked and the current sensing node CSO may maintain the precharge level.

Thereafter, the clamp circuit 251 may maintain or change the potential level of the internal sensing node SEN according to the current amount of the current sensing node CSO in response to the internal sensing node sensing, signal SA_SENSE. Subsequently, the internal, sensing node SEN may be floated.

The current determination circuit 252 may control the page buffer PB1 to perform the sensing data latch operation during a time period during which the strobe signal SA_STB_N<0> is activated. The current determination circuit 252 may be turned on or off in response to the potential level of the internal sensing node SEN so that the internal power supply VDC_PB may be applied to or blocked from the latch circuit 300 thereby controlling the sensing data latch operation of the corresponding one among the page buffers PB1 to PBk.

The plurality of strobe signals SA_STB_N<7:0> may be generated to be sequentially activated by the strobe signal generation circuit 160. The plurality of page buffers PB1 to PBk may perform the sensing data latch operation in response to the plurality of strobe signals SA_STB_N<7:0> sequentially activated, respectively. The sequential activation of the plurality of strobe signals SA_STB_N<7:0> may prevent the simultaneous sensing data latch operations of the plurality of page buffers PB1 to PBk, therefore prevent voltage drop of the internal power supply VDC_PB due to current consumption in the current determination circuit 252 of the respective page buffers PB1 to PBk, and therefore prevent erroneous sensing operation of the respective page buffers PB1 to PBk.

As described above, according to the embodiment of the present disclosure, the plurality of page buffers PB1 to PBk sequentially perform the sensing data latch operation during the read operation of the semiconductor memory device thereby preventing erroneous sensing operation of the respective page buffers PB1 to PBk due to the voltage drop of the internal power supply VDC_PB.

In an embodiment of the present disclosure, a read operation of the semiconductor memory device has been exemplarily described, but a program verify operation for verifying a program state of a memory cell may also be applied in the same manner. That is, it is desirable to use the above-described operation method in a read operation and a program verify operation using a sensing operation of a page buffer.

Figure 6:
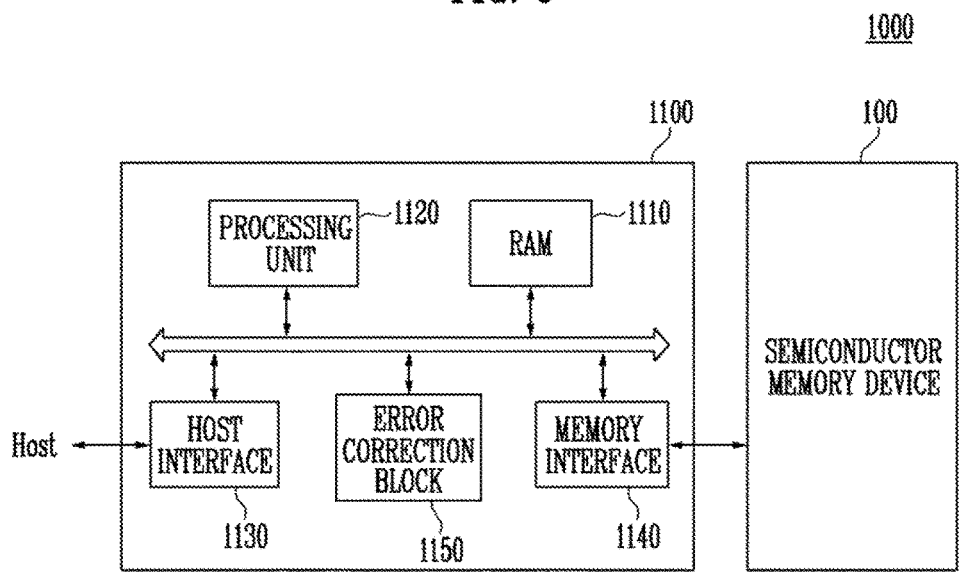
FIG. 6 is a block diagram showing a memory system including the semiconductor memory device of FIG. 1 according to an embodiment of the present disclosure.

FIG. 6 is a block diagram showing a memory system including the semiconductor memory device of FIG. 1.

Referring to FIG. 6, a memory system 1000 may include the semiconductor memory device 100 and a controller 1100.

The semiconductor memory device 100 may be configured as described with reference to FIG. 1 and operate accordingly. Hereinafter, repetition will be omitted.

The controller 1100 may be coupled to a host Host and to the semiconductor memory device 100. In response to a request from the host Host, the controller 1100 may be configured to access the semiconductor memory device 100. For example, the controller 1100 may be configured to control read, write, erase, and background operations of the semiconductor memory device 100. The controller 1100 may be configured to provide an interface between the semiconductor memory device 100 and the host Host. The controller 1100 may be configured to drive a firmware for controlling the semiconductor memory device 100.

The controller 1100 may include a random access memory (RAM) 1110, a processing unit 1120, a host interface 1130, a memory interface 1140, and an error correction block 1150 coupled via an internal bus. The RAM 1110 may be used as one of an operation memory of the processing unit 1120, a cache memory between the semiconductor memory device 100 and the host Host, and a buffer memory between the semiconductor memory device 100 and the host Host. The processing unit 1120 may control all operations of the controller 1100. In addition, the controller 1100 may temporarily store program data provided from the host Host during the write operation.

The host interface 1130 may include a protocol for performing data exchange between the host Host and the controller 1100. In an exemplary embodiment, the controller 1100 may be configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1140 may interface with the semiconductor memory device 100. For example, the memory interface may include a NAND interface or a NOR interface.

The error correction block 1150 may be configured to detect and correct errors in the data received from the semiconductor memory device 100 by using an error correcting code (ECC). The processing unit 1120 may control the semiconductor memory device 100 to adjust a read voltage according to the error detection result of the error correction block 1150 to perform a re-reading operation. In the illustrated exemplary embodiment of FIG. 6, the error correction block 1150 is provided as a separate constituent of the controller 1100, however, the invention is not limited in this way. For example, in other embodiments the error correction block 1150 may be an integral part of the processing unit 1120.

The controller 1100 and the semiconductor memory device 100 may be integrated into a single semiconductor device. In an exemplary embodiment, the controller 1100 and the semiconductor memory device 100 may be integrated into a single semiconductor device to form a memory card. For example, the controller 1100 and the semiconductor memory device 100 may be integrated into a single semiconductor device to form a memory card such as a personal computer memory card international association (PCMCIA), a compact flash card (CF), a smart media card (SM and SMC), a memory stick, a multimedia card (MMC, RS-MMC, and MMCmicro), an SD card (SD, miniSD, microSD, and SDHC), and a universal flash memory device (UFS), and the like.

The controller 1100 and the semiconductor memory device 100 may be integrated into a single semiconductor device to form a solid state drive (SSD). The solid state drive (SSD) may include a storage device configured to store data in a semiconductor memory. When the memory system 1000 is used as a solid state drive (SSD), an operation speed of the host Host coupled to the memory system 2000 may be significantly unproved.

In another embodiment, the memory system 1000 may be provided as one of various elements of an electronic device such as a computer, a ultra-mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an exemplary embodiment, the semiconductor memory device 100 or the memory system 1000 may be embodied in various types of packages. For example, the semiconductor memory device 100 or the memory system 1000 may embodied in various packages such as a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP) a thin quad flatpack (TQFP), a small outline (SOIC), a shrink small outline package (SSOP), a thin small outline (TSOP), a thin quad flatpack (TQFP), a system in package (SIP), a multi-chip package (MCP), a wafer-level fabricated package (WFP), a wafer-level processed stack package (WSP) or the like.

Figure 7:
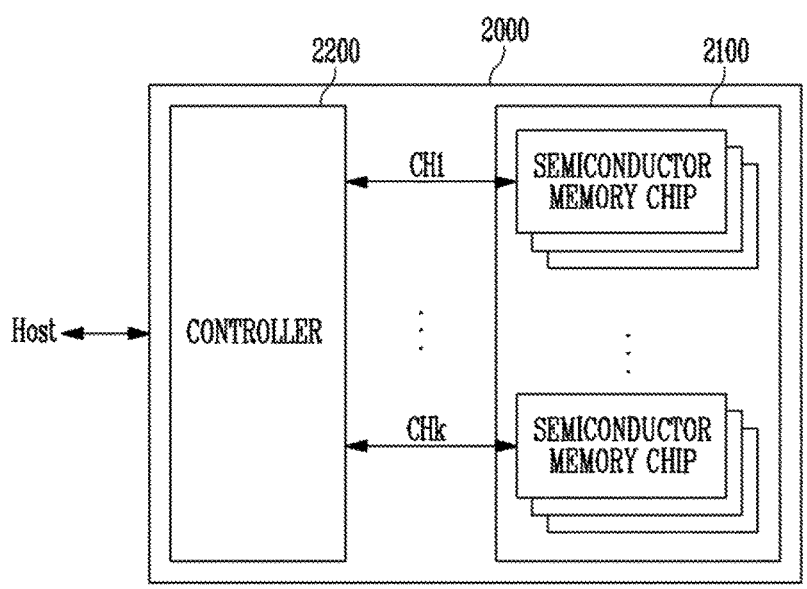
FIG. 7 is a block diagram showing an application example of the memory system of FIG. 6 according to an embodiment of the present disclosure.

FIG. 7 is a block diagram showing an application example of the memory system of FIG. 6.

Referring to FIG. 7, a memory system 2000 may include a semiconductor memory device 2100 and a controller 2200. The semiconductor memory device 2100 may include a plurality of semiconductor memory chips. The plurality of semiconductor memory chips may be divided into a plurality of groups.

Referring to FIG. 7, the plurality of groups are shown to communicate with the controller 2200 through first to kth channels CH1 to CHk, respectively. Each semiconductor memory chip may be configured similarly with one of the semiconductor memory devices 100 described with reference to FIG. 1 and operate accordingly.

Each semiconductor memory chip group may be configured to communicate with the controller 2200 through a single common channel CH1 to CHk. The controller 2200 may be similar with the controller 1100 described with reference to FIG. 6 and may be configured to control the plurality of memory chips of the semiconductor memory device 2100 through the plurality of channels CH1 to CHk.

Figure 8:
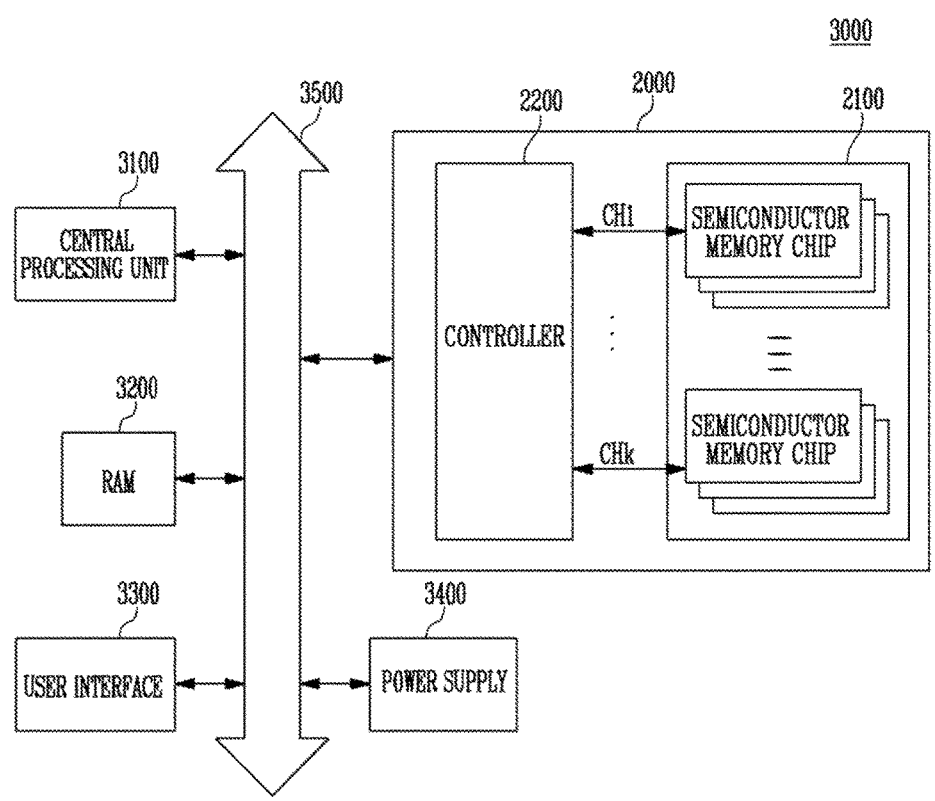
FIG. 8 is a block diagram showing a computing system including the memory system shown with reference to FIG. 7 according to an embodiment of the present disclosure.

FIG. 8 is a block diagram showing a computing system 3000 including the memory system 2000 illustrated with reference to FIG. 7.

Referring to FIG. 8, the computing system 3000 may include a central processing unit 3100, a random access memory (RAM) 3200, a user interface 3300, a power supply 3400, a system bus 3500, and the memory system 2000.

The memory system 2000 may be electrically connected to the central processing unit 3100, the RAM 3200, the user interface 3300, and the power supply 3400 through the system bus 3500. Data provided via the user interface 3300 or processed by the central processing unit 3100 may be stored in the memory system 2000.

In FIG. 8, the semiconductor memory device 2100 is shown to be coupled to system bus 3500 via controller 2200. However, the semiconductor memory device 2100 may be configured to be coupled directly to the system bus 3500. In such alternative configuration, the functions of the controller 2200 will be performed by the central processing unit 3100 and the RAM 3200.

In FIG. 8, the memory system 2000 described with reference to FIG. 7 is provided. However, the memory system 2000 may be replaced by the memory system 1000 described with reference to FIG. 6. In an exemplary embodiment, the computing system 3000 may be configured to include both of the memory systems 1000 and 2000 described with reference to FIGS. 6 and 7.

According to the present disclosure, a sensing operation is performed by using a page buffer during a verify operation or a read operation of a semiconductor memory device, and an operation of sensing data and storing the data in a latch is performed at different timings for each page buffer, thereby prevent a power supply from being dropped.

While the disclosure has been shown and described with reference to certain preferred embodiments thereof, it will be understood by those skilled in the art that various changes and modifications may be made without departing from the spirit and scope of the disclosure. Therefore, the scope of the present disclosure should not be limited to the above-described embodiments, but should be determined by the following claims and their equivalents.

What is claimed is:

1. A semiconductor memory device, comprising:
   a memory cell array including a plurality of memory cells coupled to a plurality of bit lines; and
   a page buffer circuit coupled to the plurality of bit lines and including a plurality of page buffers,
   wherein the plurality of page buffers sense program states of the plurality of memory cells through the plurality of bit lines during a verify operation or a read operation of a program operation, and
   wherein the plurality of page buffers sequentially perform latch operations for latching sensing data in accordance with current amounts of the plurality of bit lines.

2. The semiconductor memory device according to claim 1, wherein each of the plurality of page buffers performs each of the latch operations in response to a corresponding one of a plurality of strobe signals.

3. The semiconductor memory device according to claim 2, further comprising a strobe signal generation circuit generating the plurality of strobe signals,
wherein the plurality of strobe signals have different activation periods.

4. The semiconductor memory device according to claim 3, wherein the strobe signal generation circuit generates the plurality of strobe signals alternately activated in response to an enable signal and a clock signal during the latch operations.

5. The semiconductor memory device according to claim 3, wherein the strobe signal generation circuit includes a plurality of delay signal generators and a plurality of inverters.

6. The semiconductor memory device according to claim 3, wherein the strobe signal generation circuit comprises:
a first delay signal generator generating an output signal in response to an enable signal and a clock signal;
a first inverter outputting a first strobe signal, among the plurality of strobe signals, by inverting the output signal of the first delay signal generator;
a second delay signal generator generating an output signal in response to the output signal of the first delay signal generator and the clock signal; and
a second inverter outputting a second strobe signal, among the plurality of strobe signals, by inverting the output signal of the second delay signal generator.

7. The semiconductor memory device according to claim 6, wherein each of the first and second delay signal generators includes a DQ flip flop unit.

8. The semiconductor memory device according to claim 2, wherein each of the plurality of page buffers comprises:
a latch circuit latching the sensing data;
a page buffer sensing circuit electrically connecting one of the plurality of bit lines with a current sensing node in response to a page buffer sensing signal; and
a current control circuit supplying an internal power supply to the current sensing node, and controlling supply of the internal power supply to the latch circuit in response to an internal sensing node to which a potential level of the current sensing node is reflected and one of the plurality of strobe signals.

9. The semiconductor memory device according to claim 2,
wherein the plurality of page buffers are divided into page groups, which respectively correspond to input/output data lines, and
wherein page buffers in each of the page groups perform the latch operations in response to a corresponding one of the plurality of strobe signals.

10. A semiconductor memory device, comprising:
a memory cell array including a plurality of memory cells coupled to a plurality of bit lines;
a strobe signal generation circuit alternately generating a plurality of strobe signals having different activation periods; and
a page buffer circuit coupled to the plurality of bit lines and including a plurality of page buffers,
wherein the plurality of page buffers sense program states of the plurality of memory cells through the plurality of bit lines during a verify operation or a read operation of a program operation, and
wherein the plurality of page buffers perform a latch operation for latching sensing data in response to the plurality of strobe signals.

11. The semiconductor memory device according to claim 10, wherein the strobe signal generation circuit generates the plurality of strobe signals alternately activated in response to an enable signal and a clock signal during the latch operation.

12. The semiconductor memory device according to claim 10, wherein the strobe signal generation circuit comprises:
a first delay signal generator generating an output signal in response to an enable signal and a clock signal;
a first inverter outputting a first strobe signal, among the plurality of strobe signals, by inverting the output signal of the first delay signal generator;
a second delay signal generator generating an output signal in response to the output signal of the first delay signal generator and the clock signal; and
a second inverter outputting a second strobe signal, among the plurality of strobe signals, by inverting the output signal of the second delay signal generator.

13. The semiconductor memory device according to claim 12, wherein each of the first and second delay signal generators includes a DQ flip flop unit.

14. The semiconductor memory device according to claim 10, wherein each of the plurality of page buffers comprises:
a latch circuit latching the sensing data;
a page buffer sensing circuit electrically connecting one of the plurality of bit lines with a current sensing node in response to a page buffer sensing signal; and
a current control circuit supplying an internal power supply to the current sensing node, and controlling supply of the internal power supply to the latch circuit in response to an internal sensing node to which a potential level of the current sensing node is reflected and one of the plurality of strobe signals.

15. The semiconductor memory device according to claim 10,
wherein the plurality of page buffers are divided into page groups, which respectively correspond to input/output data lines, and
wherein page buffers in each of the page groups perform the latch operation in response to a corresponding one of the plurality of strobe signals.

16. The semiconductor memory device according to claim 8, wherein the current control circuit comprises:
a clamp circuit configured to supply the internal power supply to the current sensing node, and control a connection between the current sensing node and the internal sensing node by an internal sensing node sensing signal; and
a current determination circuit configured to control the supply of the internal power supply to the latch circuit in response to the internal sensing node to which the potential level of the current sensing node is reflected and one of the plurality of strobe signals,
wherein a potential level of the internal sensing node is floating, when the internal sensing node sensing signal is disabled.

17. The semiconductor memory device according to claim 14, wherein the current control circuit comprises:
a clamp circuit configured to supply the internal power supply to the current sensing node, and control a connection between the current sensing node and the internal sensing node by an internal sensing node sensing signal; and a current determination circuit configured to control the supply of the internal power supply to the latch circuit in response to the internal sensing node to which the potential level of the current sensing node is reflected and one of the plurality of strobe signals, wherein a potential level of the internal sensing node is floating when the internal sensing node sensing signal is disabled.

* * * * *